(12) United States Patent
Nakaya

(10) Patent No.: US 11,417,815 B2
(45) Date of Patent: *Aug. 16, 2022

(54) THERMOELECTRIC CONVERSION MODULE PROVIDED WITH PHOTOTHERMAL CONVERSION SUBSTRATE

(71) Applicant: Hiroaki Nakaya, Osakasayama (JP)

(72) Inventor: Hiroaki Nakaya, Osakasayama (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/490,700

(22) PCT Filed: Feb. 28, 2018

(86) PCT No.: PCT/JP2018/007569
§ 371 (c)(1),
(2) Date: Sep. 3, 2019

(87) PCT Pub. No.: WO2018/159696
PCT Pub. Date: Sep. 7, 2018

(65) Prior Publication Data
US 2020/0006615 A1    Jan. 2, 2020

(30) Foreign Application Priority Data
Mar. 3, 2017    (JP) .............................. JP2017-040999

(51) Int. Cl.
*H01L 35/22* (2006.01)
*H01L 35/30* (2006.01)
(Continued)

(52) U.S. Cl.
CPC .............. *H01L 35/22* (2013.01); *H01L 35/24* (2013.01); *H01L 35/30* (2013.01); *H01L 35/32* (2013.01); *C01B 32/168* (2017.08); *C01B 32/21* (2017.08)

(58) Field of Classification Search
None
See application file for complete search history.

(56) References Cited

U.S. PATENT DOCUMENTS

| 2012/0227780 A1 | 9/2012 | Kurihara et al. |
| 2013/0118543 A1 | 5/2013 | Kim et al. |

(Continued)

FOREIGN PATENT DOCUMENTS

| JP | 2012-69625 A | 4/2012 |
| JP | 2013-254940 A | 12/2013 |

(Continued)

OTHER PUBLICATIONS

Machine translation of JP 2012-069625 A; accessed and printed Aug. 26, 2021 (Year: 2012).*

(Continued)

*Primary Examiner* — Edward J. Schmiedel
(74) *Attorney, Agent, or Firm* — Stites & Harbison, PLLC; Terry L. Wright; Jeffrey A. Haeberlin

(57) ABSTRACT

The present invention provides a thermoelectric conversion module which can utilize sunlight and solar heat by using high output charge-transport-type thermoelectric conversion elements. The present invention provides A thermoelectric conversion module which comprises at least a thermoelectric conversion module-element in which charge-transport-type thermoelectric conversion elements are formed and a photothermal conversion substrate containing photothermal conversion material, wherein the thermoelectric conversion module-element comprises an insulating substrate, and n-type and/or p-type charge-transport-type thermoelectric conversion elements are formed on the insulating substrate, wherein the charge-transport-type thermoelectric conversion element comprises a charge transport layer and thermoelectric conversion material layers and electrodes, wherein the photothermal conversion substrate is disposed so that it (Continued)

absorbs external light and converts it into heat and transfers the heat to the electrodes or the thermoelectric conversion material layers disposed on the charge transport layers.

6 Claims, 11 Drawing Sheets

(51) Int. Cl.
*H01L 35/32* (2006.01)
*H01L 35/24* (2006.01)
*C01B 32/21* (2017.01)
*C01B 32/168* (2017.01)

(56) References Cited

U.S. PATENT DOCUMENTS

| | | | |
|---|---|---|---|
| 2013/0167897 A1 | 7/2013 | Choi et al. | |
| 2014/0174495 A1* | 6/2014 | Nakaya | H01L 35/32 |
| | | | 136/204 |
| 2016/0300994 A1 | 10/2016 | Adachi et al. | |
| 2018/0254400 A1 | 9/2018 | Nakaya | |

FOREIGN PATENT DOCUMENTS

| | | |
|---|---|---|
| JP | 2015-29056 A | 2/2015 |
| JP | 2015-507846 A | 3/2015 |
| JP | 2015-135939 A | 7/2015 |
| WO | 2011/065185 A1 | 6/2011 |
| WO | 2013/012065 A1 | 1/2013 |
| WO | 2017/038831 A1 | 12/2018 |

OTHER PUBLICATIONS

Machine translation of JP 2013-254940 A; accessed and printed Aug. 11, 2021 (Year: 2013).*
Japan Patent Office, International Search Report issued in corresponding Application No. PCT/JP2018/007569 dated May 1, 2018.

* cited by examiner

FIG.5
Thermoelectric conversion module-element: e2
(1) Top view
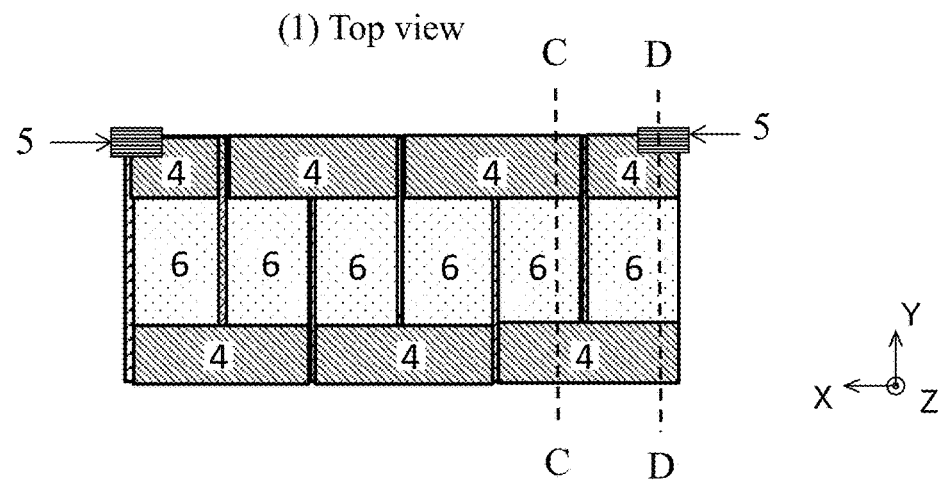
(2) Sectional view of line C-C
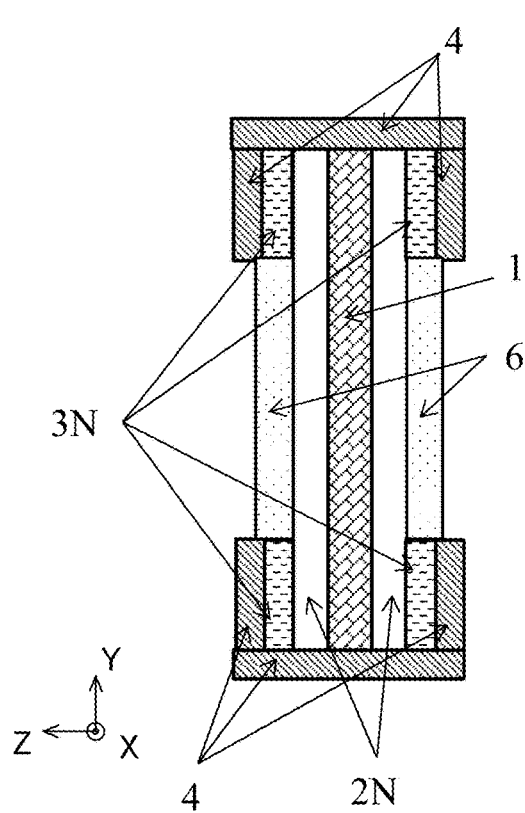
(3) Sectional view of line D-D
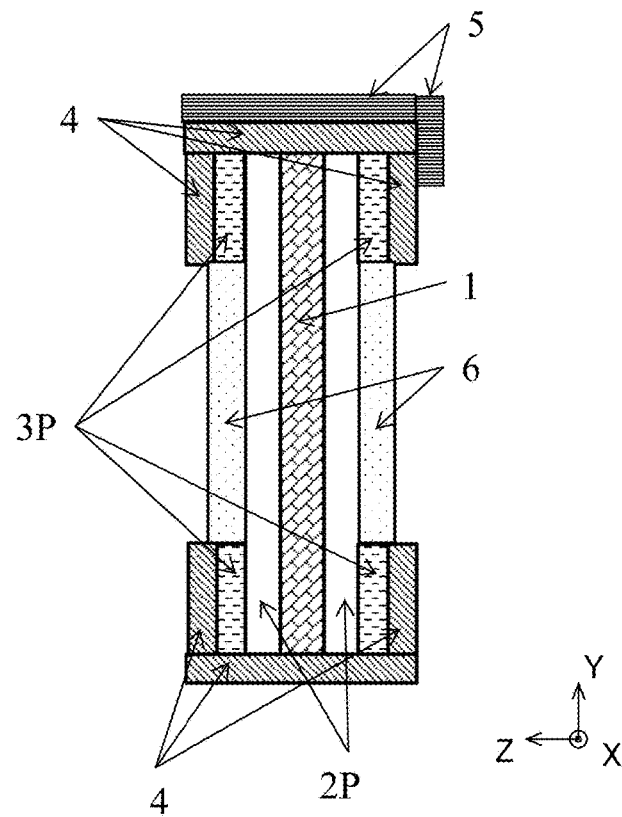

Top view of the first thermoelectric conversion module: M1

FIG.8
(1) Perspective view of thermoelectric conversion module: M2
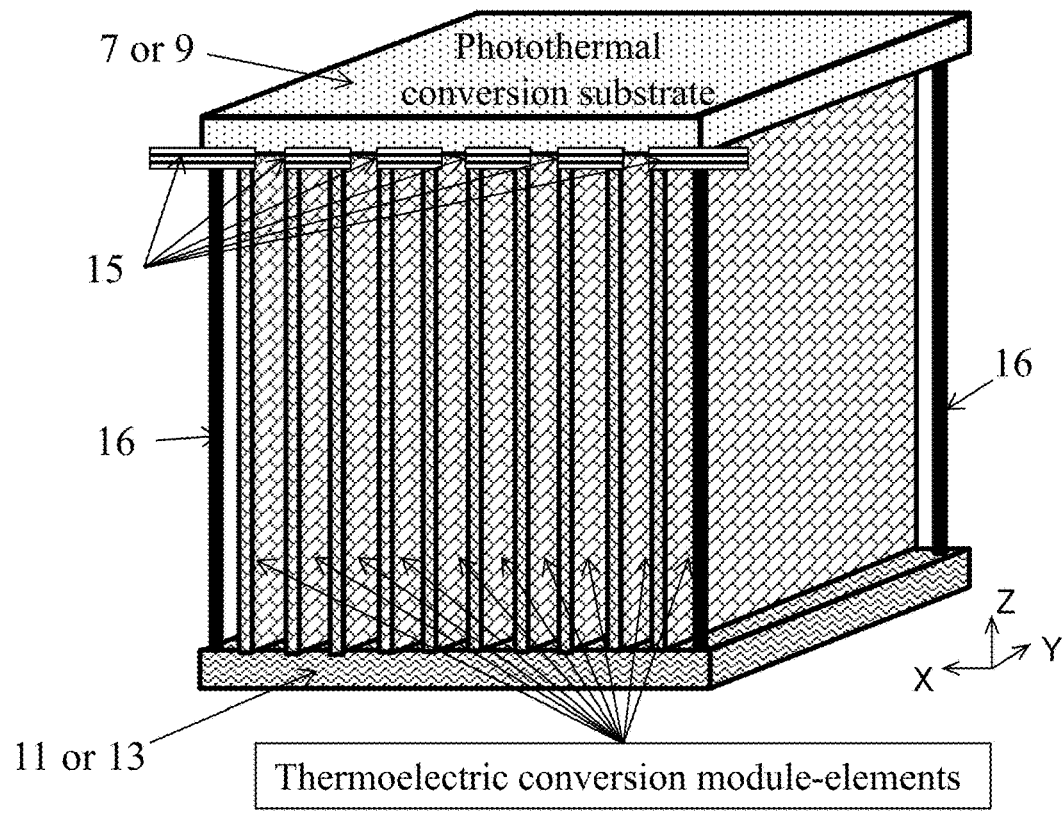
(2) Top view of thermoelectric conversion module: M2
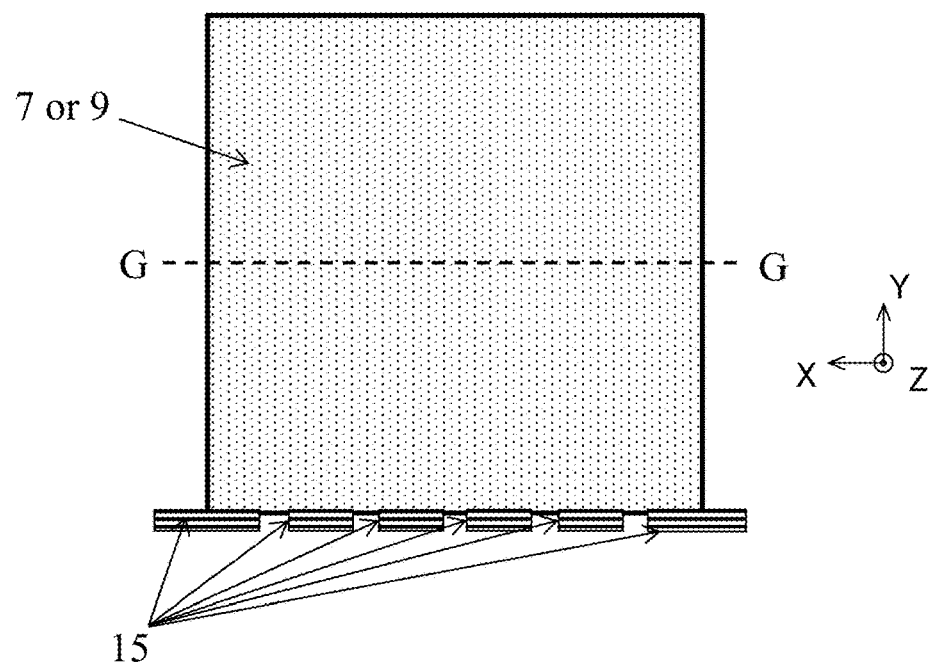

FIG.9
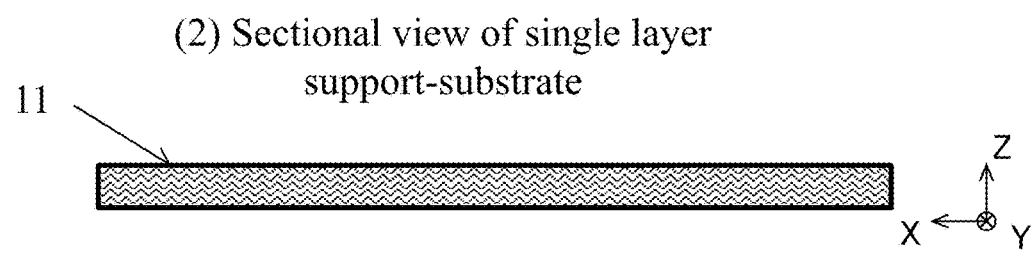
(2) Sectional view of single layer support-substrate
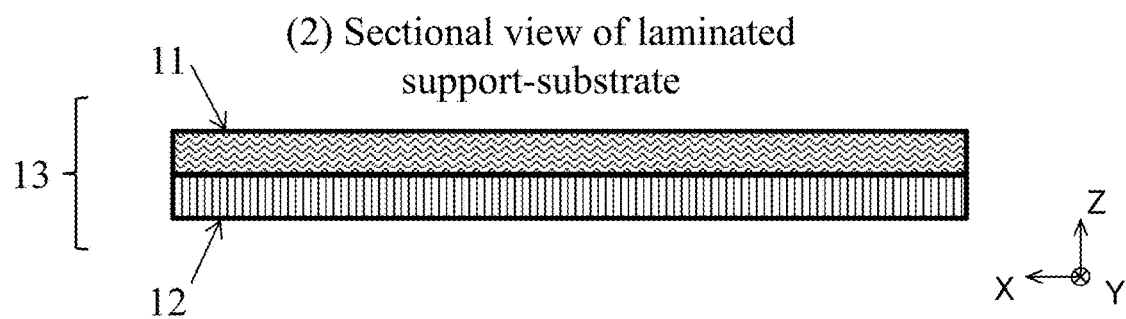
(2) Sectional view of laminated support-substrate FIG.10
(1) Perspective view of thermoelectric conversion module: M3
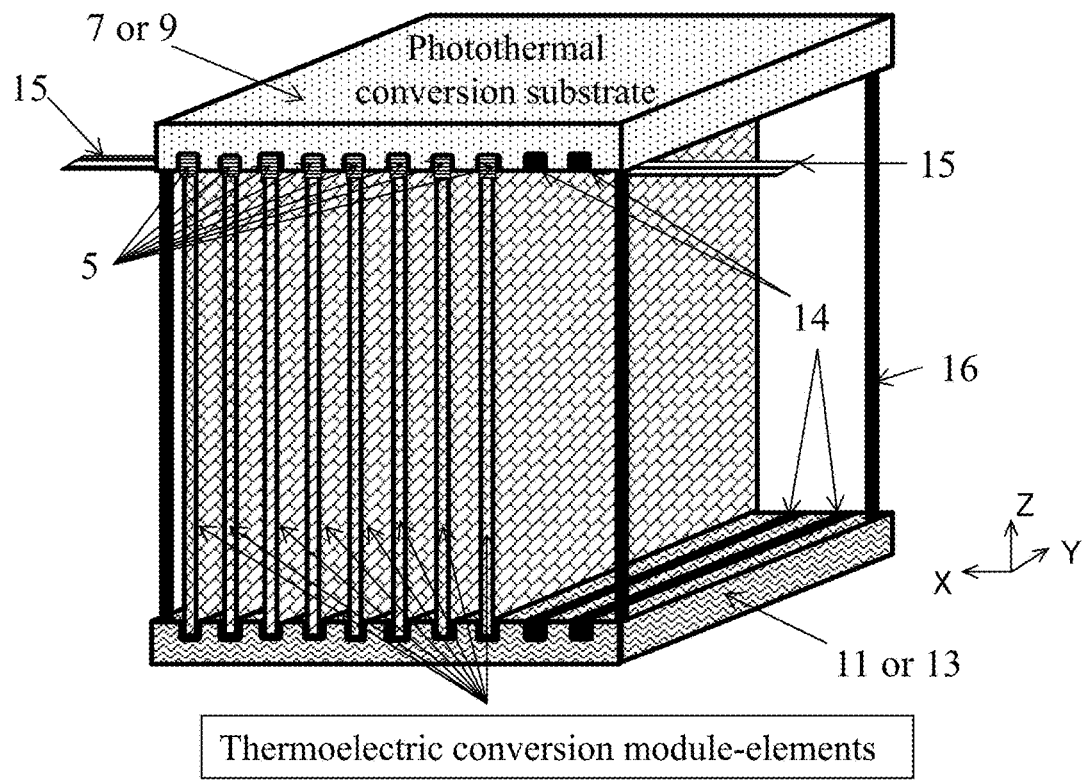
Thermoelectric conversion module-elements
(2) Top view of thermoelectric conversion module: M3
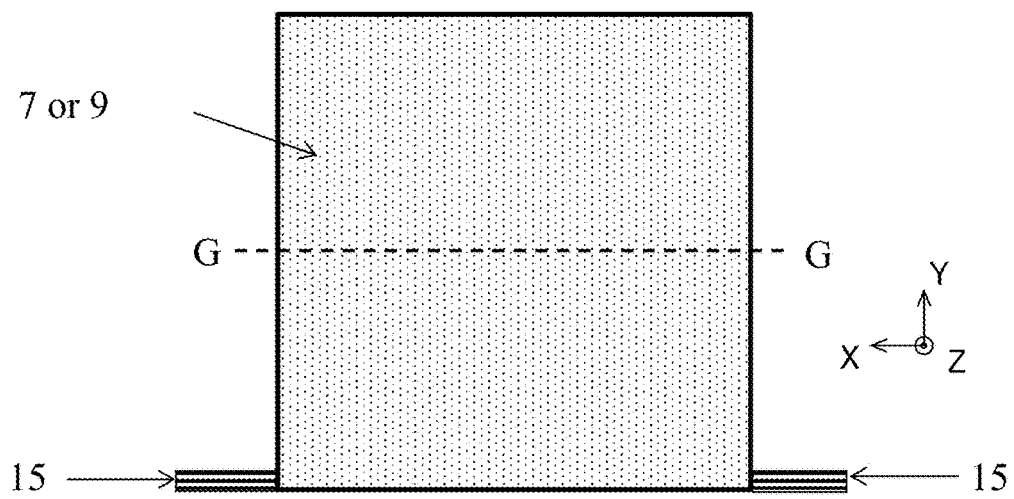

FIG.11
(1) Bottom view of photothermal conversion substrate
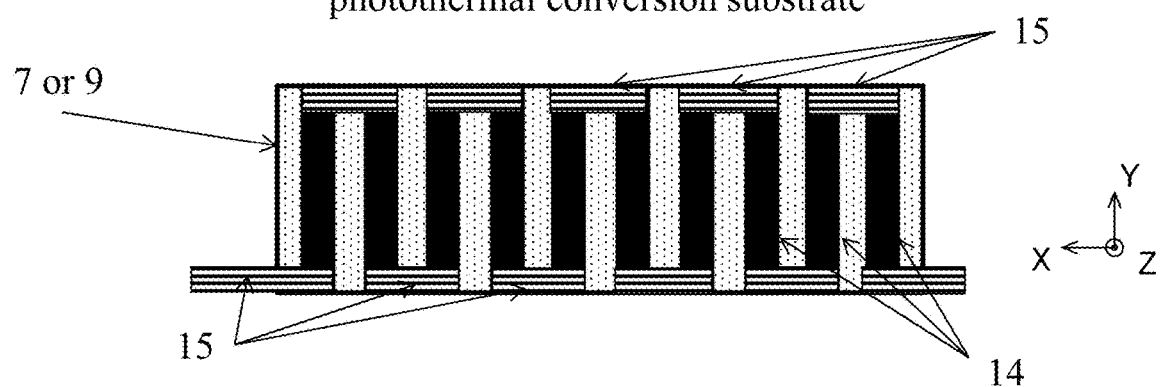
(2) Top view of support-substrate
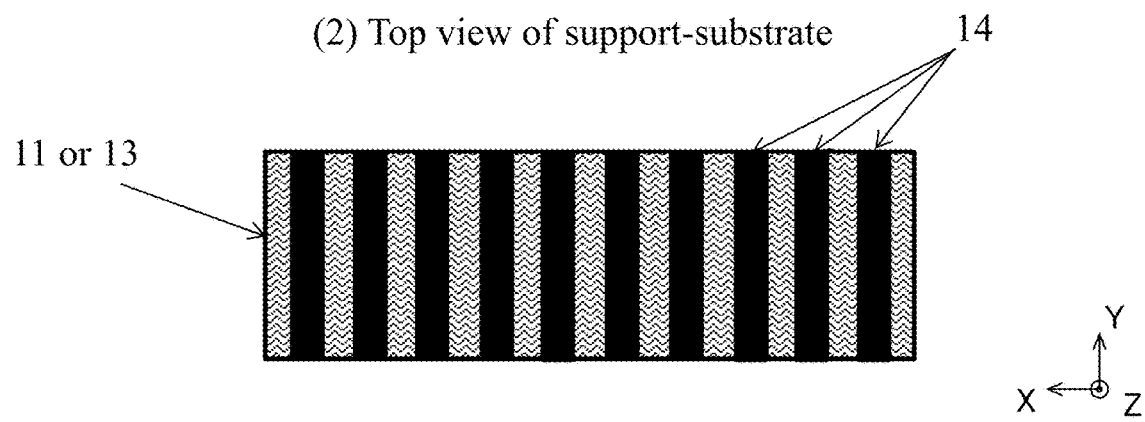

THERMOELECTRIC CONVERSION MODULE PROVIDED WITH PHOTOTHERMAL CONVERSION SUBSTRATE

TECHNICAL FIELD

The present invention relates to thermoelectric conversion modules.

BACKGROUND ART

Thermoelectric conversion elements are known as clean energy conversion elements without the use of petroleum or ozone. In recent years, highly efficient thermoelectric conversion elements and thermoelectric conversion modules are desired as one of global warming countermeasures.

As shown in FIG. 2, a conventional thermoelectric conversion element has a n-type structure in which block-shaped an n-type and a p-type thermoelectric conversion material are sandwiched between upper and lower electrodes and are connected with an upper electrode, and it basically consists of thermoelectric conversion material and electrodes. Therefore, the thermoelectric conversion material is required to have the following three characteristics, to be a material having a large Seebeck coefficient as the ability to convert heat to electricity, to be a material having a low thermal conductivity in order to ensure a temperature difference between the high temperature portion and the low temperature portion, and to be a material having high electric conductivity in order to suppress power consumption due to generated current. However, as shown in FIG. 3, the Seebeck coefficient and the electric conductivity have physically contradictory characteristics, and BiTe-based material exists around a maximum value. Therefore, BiTe-based material is used in many thermoelectric conversion elements currently in practical use, however they do not have sufficient thermoelectric conversion efficiency and power generation by thermoelectric conversion elements has not been put to practical use in general. In addition, although many new thermoelectric conversion material has been developed, most of them are aimed at lowering the thermal conductivity of the material and it is difficult to drastically improve the thermoelectric conversion efficiency and they have not been put into practical use at present.

RELATED ART DOCUMENTS

Patent Document 1: WO 2013/012065 A1
Patent Document 2: WO 2017/038831 A1

SUMMARY OF THE INVENTION

Problems to be Solved by the Invention

Conventional thermoelectric conversion elements have been developed by concurrently letting three characteristics have in thermoelectric conversion material, which are high Seebeck coefficient, high electric conductivity and low thermal conductivity. However, it is difficult to obtain a material that simultaneously satisfies these three properties, in particular, if a thermoelectric conversion material having high electric conductivity is used to improve the internal resistance of the thermoelectric conversion material layer, the Seebeck coefficient decreases (see FIG. 3), as a result, there is a problem that it is impossible to obtain a large output. Further, a thermoelectric conversion module that generates power by solar heat and solar light using high-power thermoelectric conversion elements has not been put to practical use in general and there is a problem that it is not known what kind of structure is appropriate.

The present invention has been made in view of the above problems, it is an object of the present invention to provide a thermoelectric conversion module that makes it possible to utilize sunlight and solar heat by using high output charge-transport-type thermoelectric conversion elements (see Patent Documents 1 and 2) that can use thermoelectric conversion material which has not been used up to now because of their very low electric conductivity even though the Seebeck coefficient is high, but which have become available by using a charge transport layer having high electric conductivity.

Means for Solving the Problems

According to the present invention, thermoelectric conversion module which comprises at least a thermoelectric conversion module-element in which charge-transport-type thermoelectric conversion elements are formed and a photothermal conversion substrate containing photothermal conversion material. Here, the thermoelectric conversion module-element comprises an insulating substrate, and n-type and/or p-type charge-transport-type thermoelectric conversion elements are formed on the insulating substrate, wherein the charge-transport-type thermoelectric conversion element comprises a charge transport layer and thermoelectric conversion material layers and electrodes, wherein the charge transport layer comprises a sheet-like n-type charge transport layer treated to dope charge-donating material so as to give an n-type semiconductor property or a sheet-like p-type charge transport layer treated to dope charge-accepting material so as to give a p-type semiconductor property.

Further the photothermal conversion substrate is disposed so that it absorbs external light and converts it into heat and transfers the heat to the electrodes or the thermoelectric conversion material layers disposed on the charge transport layers.

Effects of the Invention

According to the present invention, thermoelectric conversion module which makes it possible to utilize sunlight and solar heat is provided, this has got possible by using high output charge-transport-type thermoelectric conversion elements that can use thermoelectric conversion material which has not been used up to now because of their very low electric conductivity even though the Seebeck coefficient is high, but which have become available by using a charge transport layer having high electric conductivity.

(1) shows a top view of the charge-transport-type thermoelectric conversion element.
(2) shows a sectional view taken along line A-A of the charge-transport-type thermoelectric conversion element in (1).
(3) shows a sectional view taken along line B-B of the charge-transport-type thermoelectric conversion element in (1).

Figure 2:
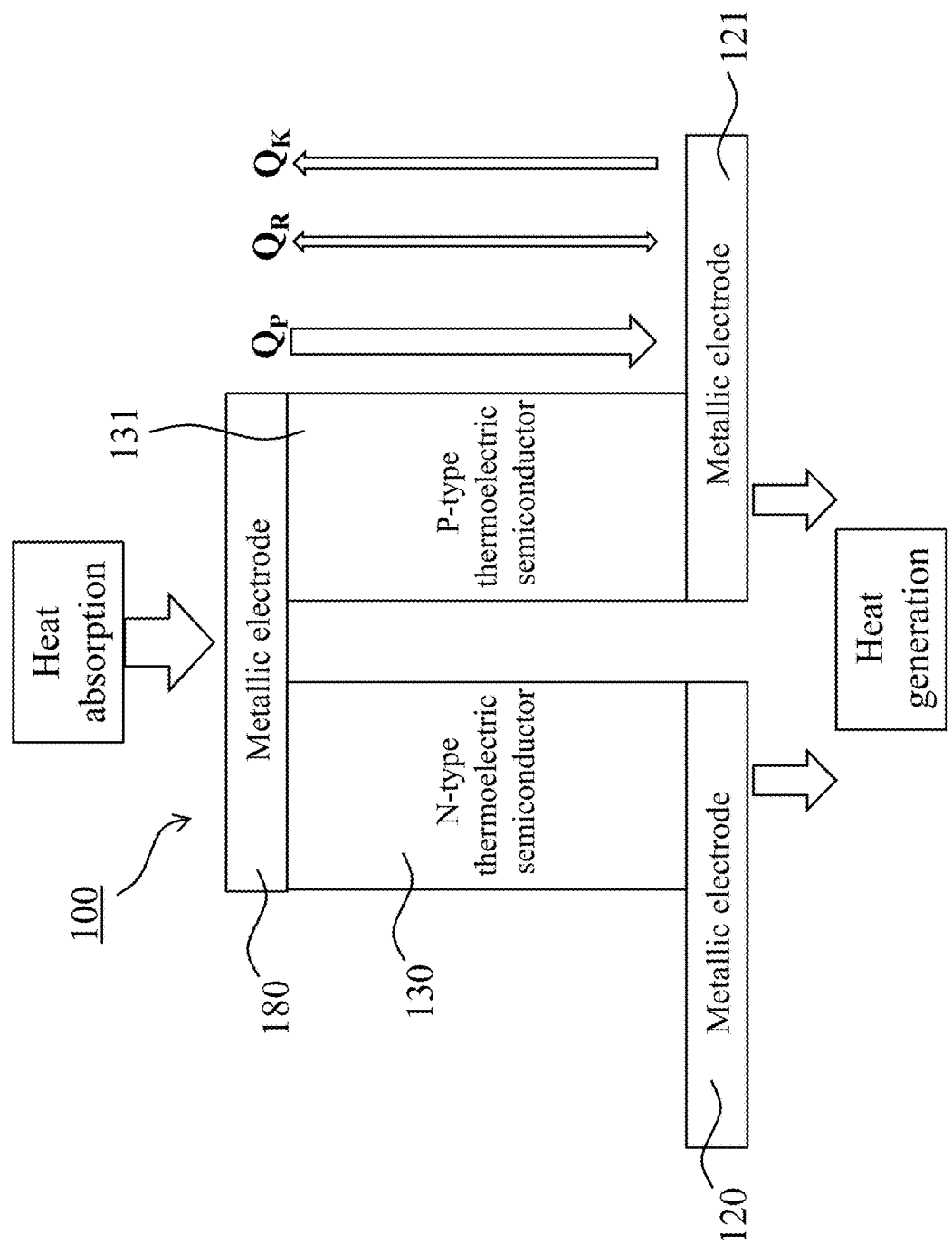

FIG. 2 is a configuration diagram of a conventional thermoelectric conversion element.

Figure 3:
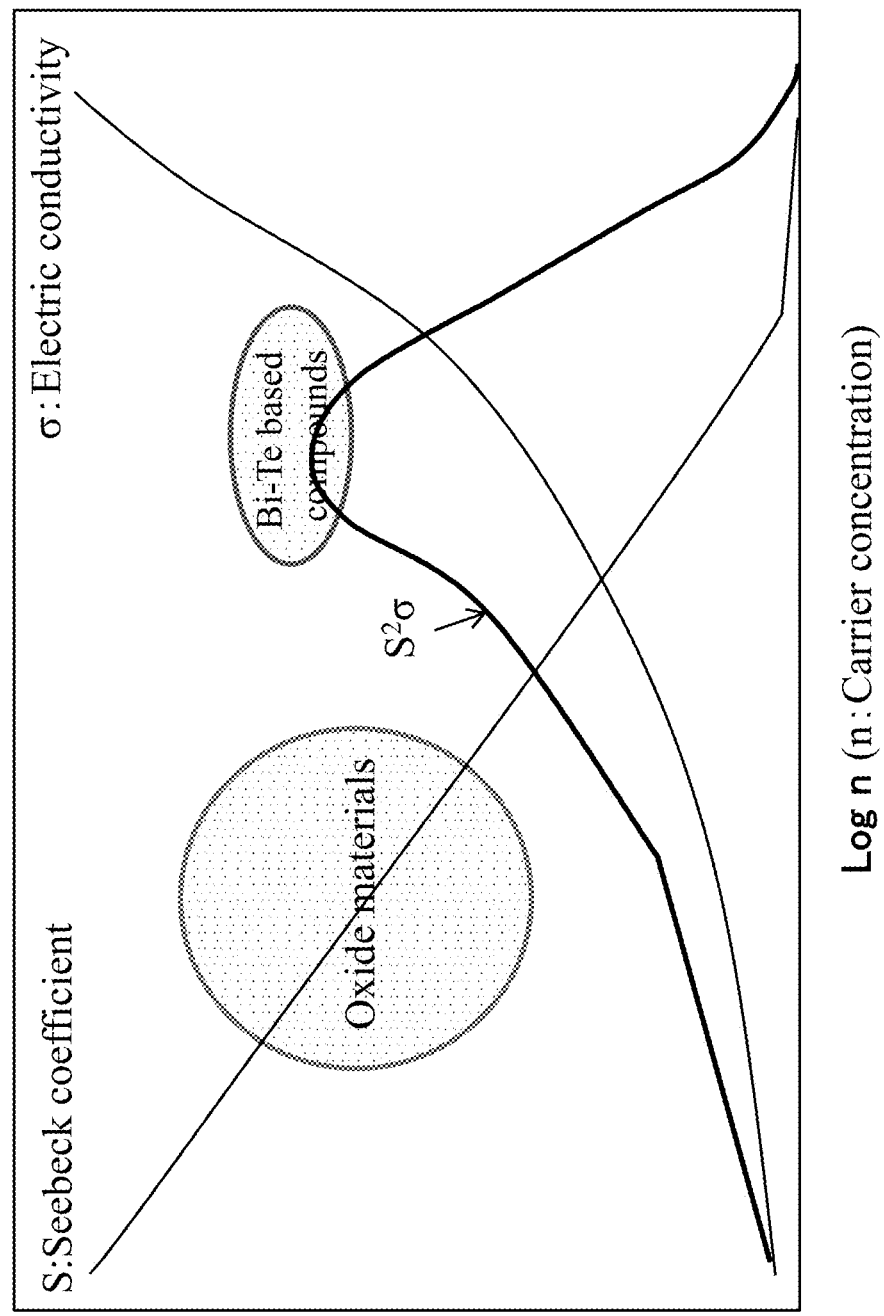

FIG. 3 is a schematic diagram for showing thermoelectric performance characteristics (room temperature) of thermoelectric conversion material.

Figure 4:
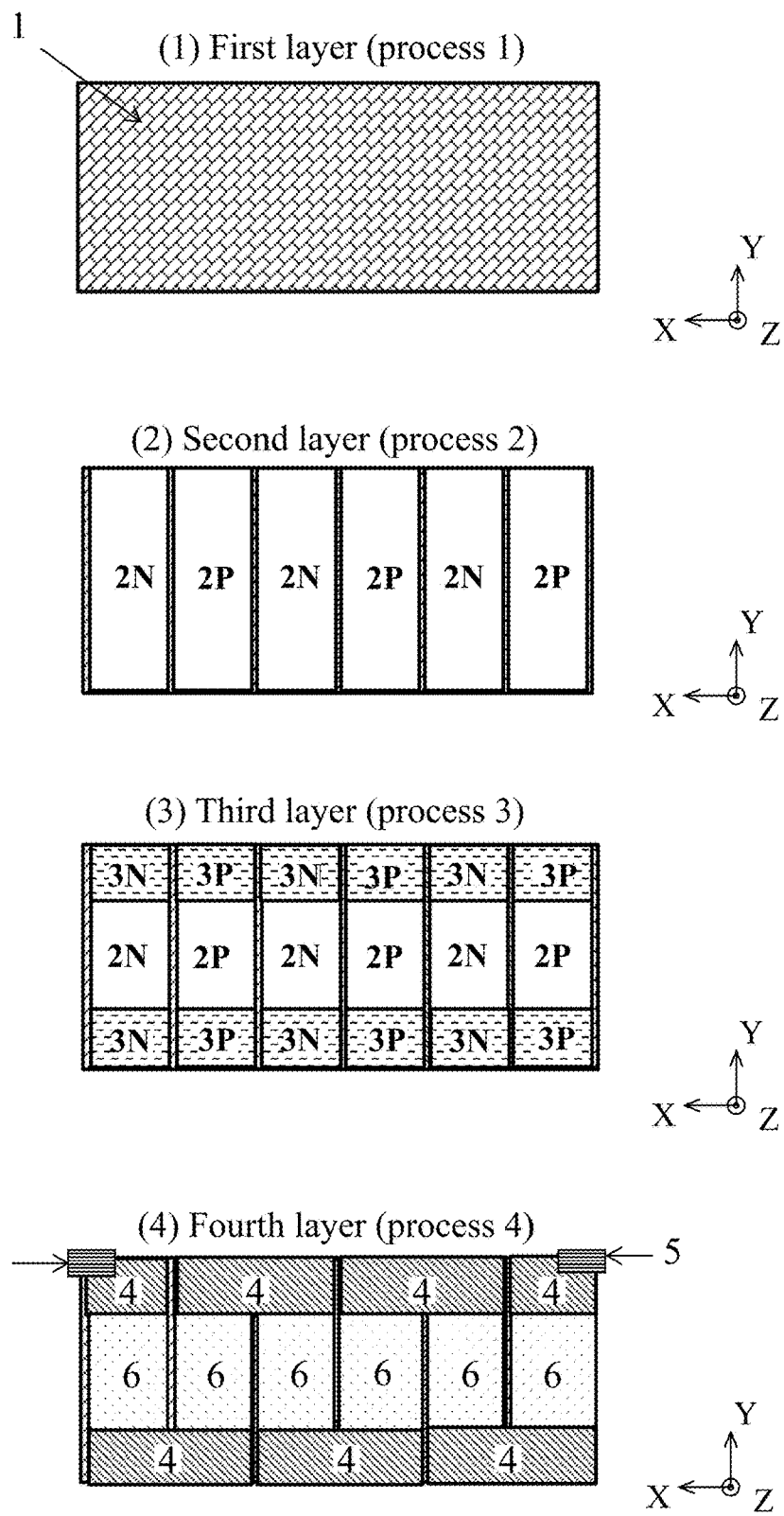

FIG. 4 is an explanatory diagram for showing an example of production processes of a thermoelectric conversion module-element: e1 of the present invention.
(1) shows the first layer (process 1) of the thermoelectric conversion module-element: e1.
(2) shows the second layer (process 2) of the thermoelectric conversion module-element: e1.
(3) shows the third layer (process 3) of the thermoelectric conversion module-element: e1.
(4) shows the forth layer (process 4) of the thermoelectric conversion module-element: e1.

FIG. 5 is a schematic diagram of a thermoelectric conversion module-element: e2 of the present invention.
(1) shows a top view of the thermoelectric conversion module-element: e2.
(2) shows a sectional view taken along line C-C of the thermoelectric conversion module-element: e2 in (1).
(3) shows a sectional view taken along line D-D of the thermoelectric conversion module-element: e2 in (1).

Figure 6:
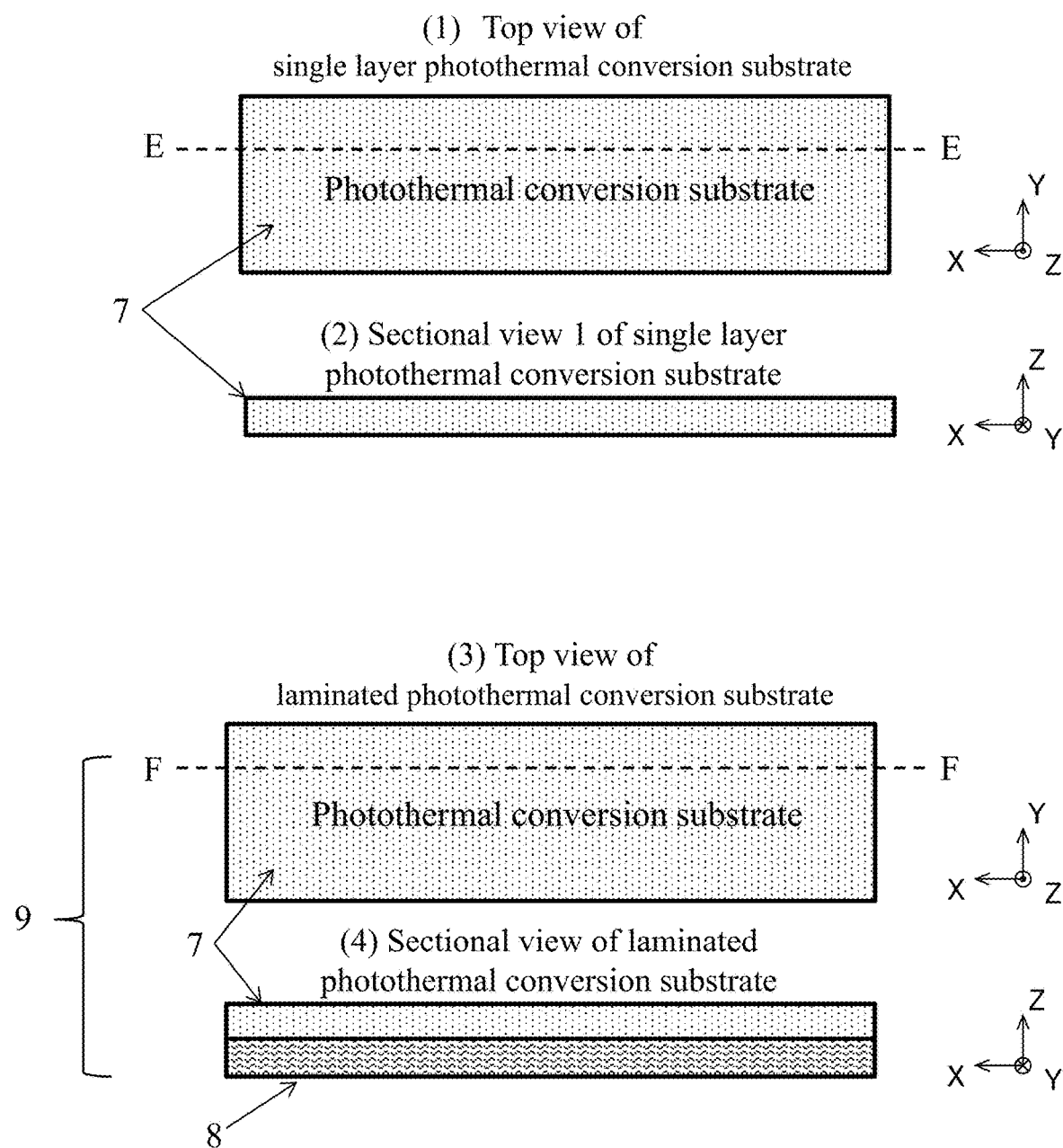

FIG. 6 is a schematic diagram of photothermal conversion substrates used in the present invention.
(1) shows a top view of the single layer photothermal conversion substrate used in the present invention,
(2) shows a sectional view taken along line E-E in (1).
(3) shows a top view of the laminated photothermal conversion substrate used in the present invention,
(4) shows a sectional view taken along line F-F in (3).

Figure 7:
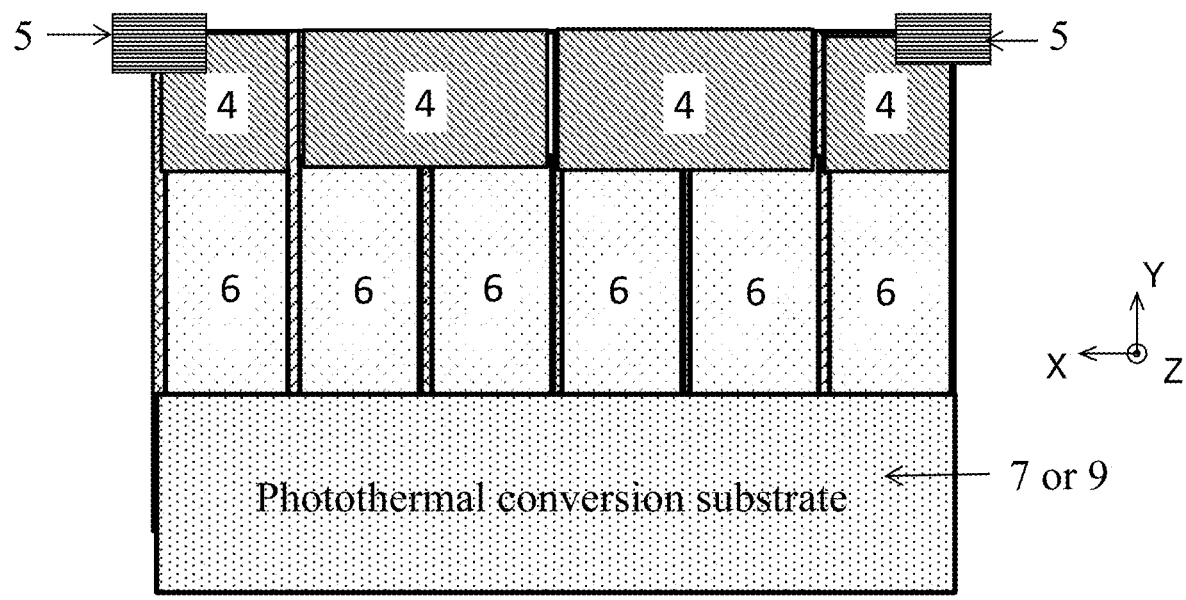

FIG. 7 shows a top view of the first thermoelectric conversion module: M1 of the present invention.

FIG. 8 is a schematic diagram of the second thermoelectric conversion module: M2 of the present invention.
(1) shows a perspective view of the second thermoelectric conversion module: M2.
(2) shows a top view of the second thermoelectric conversion module: M2.

FIG. 9 shows a sectional view of support-substrates of the second thermoelectric conversion module: M2 of the present invention.
(1) shows a sectional view taken along line G-G in FIG. 8(2) of the single layer support-substrate used as the support-substrate.
(2) shows a sectional view taken along the line G-G in FIG. 8(2) of the laminated support-substrate used as the support-substrate.

FIG. 10 is a schematic diagram of the third thermoelectric conversion module: M3 of the present invention.
(1) shows a perspective view of the third thermoelectric conversion module: M3.
(2) shows a top view of the third thermoelectric conversion module: M3.

FIG. 11(1) is a bottom view of a photothermal conversion substrate of the third thermoelectric conversion module: M3.

FIG. 11(2) is a top view of a support-substrate of the third thermoelectric conversion module: M3.

MODE FOR CARRYING OUT THE INVENTION (i) A thermoelectric conversion module of the present invention comprises at least a thermoelectric conversion module-element in which charge-transport-type thermoelectric conversion elements are formed and a photothermal conversion substrate containing photothermal conversion material, wherein the thermoelectric conversion module-element comprises an insulating substrate, and n-type and/or p-type charge-transport-type thermoelectric conversion elements are formed on the insulating substrate, wherein the charge-transport-type thermoelectric conversion element comprises a charge transport layer and thermoelectric conversion material layers and electrodes.

Here, the charge transport layer comprises a sheet-like n-type charge transport layer treated to dope charge-donating material so as to give an n-type semiconductor property or a sheet-like p-type charge transport layer treated to dope charge-accepting material so as to give a p-type semiconductor property.

In addition, in the case where the charge transport layer is n-type, an n-type thermoelectric conversion element is constituted by forming n-type thermoelectric conversion material layers and electrodes on both end portions of the charge transport layer. On the other hand, in the case where the charge transport layer is p-type, a p-type thermoelectric conversion element is constituted by forming p-type thermoelectric conversion material layers and electrodes on both end portions of the charge transport layer.

Further, the photothermal conversion substrate is disposed so that it absorbs external light and converts it into heat and transfers the heat to the electrodes or the thermoelectric conversion material layers disposed at one end of the charge transport layers.

The "thermoelectric conversion module" of the present invention is one in which a plurality of charge-transport-type thermoelectric conversion elements are electrically connected and a photothermal conversion substrate is installed, and it is used for converting sunlight and heat into electric power.

The "charge-transport-type thermoelectric conversion element" of the present invention is a thermoelectric conversion element using a surface of a sheet with semiconductor characteristics as a charge transport layer, the surface is doped with charge-donating material or charge-accepting material so as to give an n-type or a p-type semiconductor property. In the charge-transport-type thermoelectric conversion element, for example, a graphite sheet formed into a semiconductor is provided on an insulating substrate as a charge transporting layer, and thermoelectric conversion material layers and electrodes are sequentially laminated on the both end surfaces of the graphite sheet.

The "photothermal conversion material" of the present invention is material having a function of absorbing light and converting it into heat.

As the "insulating substrate" of the present invention, it is preferable to use a substrate made of such as resin or ceramic. As the resin, for example, polypropylene, polyethylene terephthalate, polyvinylidene chloride, polycarbonate, polyvinylidene fluoride, polyamide, polyimide, polyamide imide, polyether imide, polyacetal, polycarbonate, polybutylene terephthalate, polyphenylene sulfide, polytetrafluoroethylene, fluorine Resin, phenol resin, allyl resin, melamine resin, polyester resin, epoxy resin, polyurethane resin, furan resin, silicone resin and the like may be used. It is also possible to use glass fiber, carbon fiber, or a composite synthetic resin obtained by combining resin with silica fillers or alumina fillers. A ceramic substrate made of insulating inorganic material such as silica, alumina, silicon carbide, or a glass substrate can also be used.

The "sheet-like charge transport layer having a semiconductor property" of the present invention is composed of, for example, graphite having anisotropy with respect to electric conduction characteristics. A graphite sheet manufactured from natural graphite has electric conductivities in the in-plane direction at approximately 2,000 to 10,000 S/cm, an electric conductivity in the thickness direction at approximately 1 S/cm. And a graphite sheet obtained by graphitization of a sheet of a polymer such as polyimide has electric conductivities in the in-plane direction at approximately 10000 to 25000 S/cm and an electric conductivity in a thickness direction at approximately 5 S/cm. And, the thermoelectric conversion material has an electric conductivity of approximately 500 to 1000 S/cm, therefore either of the graphite sheets can be used as an effective charge transport layer by using the high electric conductivity in the in-plane direction of the graphite.

Upon use of graphite as a charge transport layer, the graphite is pretreated so as to have n-type or p-type semiconductor property in order to perform carrier transport without energy loss between the graphite and the thermoelectric conversion material.

As methods for transforming the graphite into n-type semiconductor, it is able to use a method of heat-treating the graphite under potassium atmosphere, or a method of doping charge-donating material and the like.

As the charge-donating material for doping, it can be used at least one of the group consisting of tetrathiafulvalene (TTF),tetramethyl-tetrathiafulvalene(TMTTF),bis-et hylen-edithio-tetrathiafulvalene(BEDT-TTF), tetraselenafulvalene (TSF),triphenylphosphine(TPP),trimethoxypheny lphosphine(MeO-TPP), trifluoride-triphenylphosphine(F-TPP), diphenylphosphine(DPP), bis-diphenylphosphino-ethane(DPPE), bis-diphenylphosphino-propane(DPPP), amines, polyamines, polyethyleneimine, sodium-carbonate, lithium-carbonate, potassium-carbonate, Cu-phthalocyanine, Zn-phthalocyanine and the like, and derivatives thereof.

As methods for transforming the graphite into p-type semiconductor, it is able to use a method of introducing lattice defects into the graphite, or a method of doping charge-accepting material and the like.

As the charge-accepting material for doping, it can be used at least one of the group consisting of tetracyanoquinodimethane (TCNQ), tetrafluoro-tetracyanoquinodimethane(TCNQF4), dicyclopentyldimethoxysilane-dicyanobenzoquinone(DDQ), trinitrofluorenone(TNF), dinitrofluorenone(DNF), carbazole, 9H-carbazole-4ol, 2-hydroxy-9H-carbazole, phenyl-boronic-acid, pyridine, quinoline, imidazolu, triphenylamine and the like, and derivatives thereof.

In the present invention, the graphite sheet having a semiconductor property has such a characteristic that it hardly causes heat generation or absorption even if it contacts with thermoelectric conversion material. This is probably thought because the conduction band of the thermoelectric conversion material and the conduction band of the graphite surface having the semiconductor property exist in a state close to energies and form a junction without energy gap.

Further, it was found that the thermal conductivity of the graphite surface is greatly reduced by doping with charge-donating material or charge-accepting material. The following is known, phonon propagation of graphite propagates two-dimensionally on the graphite surface, unlike the case where phonons propagate in bulk solid three-dimensionally, therefore, by injecting lattice defects into the graphite surface, the average free path of the phonons gets equal to the distance between the lattice defects, as a result, the thermal conductivity is greatly reduced. The cause of this reduction of thermal conductivity in the present invention is considered that the doping elements instead of the lattice defects play role to inhibit the two-dimensional propagation of phonons.

The "thermoelectric conversion material" of the present invention can be used Bi-Te based compounds, oxides, or any material as long as it is a semiconductor material exhibiting Seebeck effect. In the present invention, we used oxide material which has not been much used up to now as thermoelectric conversion material because of their very low electric conductivity even though the Seebeck coefficient is high. As the oxide material, is not particularly limited, it is preferable to use metal oxides such as FeO, $Fe_2O_3$, $Fe_3O_4$, CuO, $Cu_2O$, ZnO, $Zn_{1-x}Al_xO$, SnO, $SnO_2$, MnO, NiO, CoO, $Co_2O_3$, $TiO_2$, $SrTiO_3$.

Further, the thermoelectric conversion module of the present invention may be configured as follows, or they may be appropriately combined.

(ii) The charge-transport-type thermoelectric conversion elements are formed on the front and back surfaces of the insulating substrate.

In this way, a high power thermoelectric conversion module is provided in a limited space.

(iii) The photothermal conversion substrate may be made of resin containing photothermal conversion material.

In this way, a thermoelectric conversion module which is able to effectively utilize the heat photothermal converted is provided.

(iv) The photothermal conversion substrate may be made of porous material containing photothermal conversion material.

In this way, a thermoelectric conversion module which is able to perform photothermal conversion with high efficiency is provided.

(v) The photothermal conversion substrate may comprise an upper surface layer and a lower surface layer, the upper surface layer may be made of at least one of the resin and porous material which contains photothermal conversion material, and the lower surface layer may be made of insulating material having thermal conductivity higher than that of the material forming the upper surface layer.

In this way, a thermoelectric conversion module which is able to effectively utilize the heat photothermal converted is provided.

(vi) The photothermal conversion material may be selected from the group consisting of graphite, tin oxide, antimony oxide, zirconium oxide, zirconium carbide, cesium tungsten oxide, lanthanum hexaboride, metal nanoparticles and metal nitride nanoparticles.

In this way, a thermoelectric conversion module which is able to perform photothermal conversion with high efficiency is provided.

(vii) The photothermal conversion substrate may comprise an top surface serving as a light receiving surface and a bottom surface contacting an end portion of the thermoelectric conversion module-element, and the thermoelectric conversion module may have a structure in which a plurality of thermoelectric conversion module-elements are disposed under the bottom surface of the photothermal conversion substrate.

In this way, a thermoelectric conversion module which is able to perform photothermal conversion with high efficiency is provided.

(viii) The thermoelectric conversion module may further comprise a support-substrate for supporting the thermoelectric conversion module-elements and a photothermal conversion substrate, wherein grooves may be formed on the top surface of the support-substrate and on the bottom surface of the photothermal conversion substrate for supporting the thermoelectric conversion module-elements, and wherein the thermoelectric conversion module may have a structure in which the thermoelectric conversion module-elements can be taken in and out along the grooves.

In this way, a thermoelectric conversion module which is versatilely with easily exchange of thermoelectric conversion module-elements is provided.

[Charge-Transport-Type Thermoelectric Conversion Element]

Hereinafter, the present invention is described in detail with reference to the drawings. The following description is illustrative in all respects and should not be construed as limiting the present invention.

Figure 1:
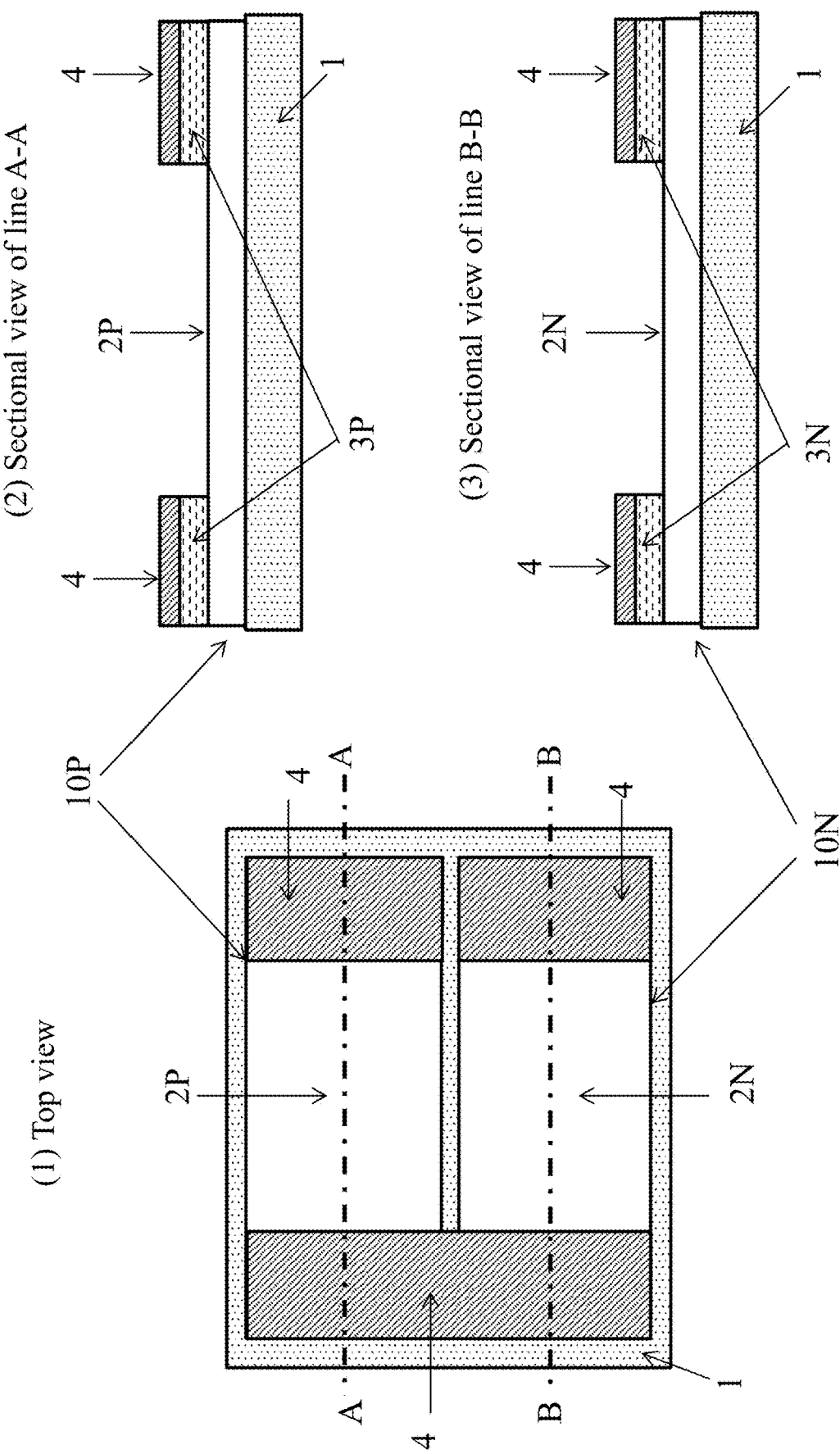
FIG. 1 is a schematic diagram of a charge-transport-type thermoelectric conversion element used in the present invention.

The charge-transport-type thermoelectric conversion element of the present invention is described based on FIG. 1.

FIG. 1 is a schematic diagram of a charge-transport-type thermoelectric conversion element used in the present invention. FIG. 1(1) shows a top view of the charge-transport-type thermoelectric conversion element, and FIG. 1(2) shows a sectional view taken along line A-A of the charge-transport-type thermoelectric conversion element in FIG. 1(1), and FIG. 1(3) shows a sectional view taken along line B-B of the charge-transport-type thermoelectric conversion element in FIG. 1(1).

In order to easily explain the charge transporting thermoelectric conversion element, in this embodiment, the charge-transport-type thermoelectric conversion element having the following construction that an n-type thermoelectric conversion element: 10N and a p-type thermoelectric conversion element: 10P are formed apart from each other on an insulating substrate: 1 in series connection is described FIG. 1 shows the structure. The n-type thermoelectric conversion element: 10N is laminated in this order of a charge transport layer: 2N, n-type thermoelectric conversion material layers: 3N and electrodes: 4 on the insulating substrate: 1. The p-type thermoelectric conversion element: 10P is laminated in this order of a charge transport layer: 2P, p-type thermoelectric conversion material layers: 3P and electrodes: 4 on the insulating substrate: 1.

In this embodiment, the graphite sheets pretreated so as to have an n-type or a p-type semiconductor property are used as charge transport layers: 2N and 2P. As the graphite sheets, PGS graphite sheets which are obtained by graphitizing polymer sheets of polyimide and the like are used. The thickness of the graphite sheets is not particularly limited, but graphite sheets having a thickness of approximately 50 to 300 μm are used.

The pretreatment for giving an n-type property is as follows, a Dimethyl sulfoxide (DMSO) solution is prepared so as to contain n-type dopants at 5 wt %, wherein n-type dopants are charge-donating material such as triphenylphosphine(TPP), diphenyl phosphate phono propane (DPPP), trimethoxyphenyl phosphine (MeO-TPP), and this solution is applied to the graphite sheet surface, then it is heated at 200° C. under $N_2$ atmosphere. This treatment is repeated five times to ensure that the charge-donating material is doped on the graphite surface. The graphite sheets pretreated in this way are used as the charge transport layer: 2N of n-type thermoelectric conversion element: 10N.

The pretreatment for giving a p-type property is as follows, a Dimethyl sulfoxide (DMSO) solution is prepared so as to contain p-type dopants at 5 wt %, wherein p-type dopants are charge-accepting material such as tetracyanoquinodimethane (TCNQ), 4-hydroxy-9H-carbazole, or carbazole, and this solution is applied to the graphite sheet surface, then it is heated at 200° C. under $N_2$ atmosphere. This treatment is repeated five times to ensure that the charge-donating material is doped on the graphite surface. The graphite sheets pretreated in this way are used as the charge transport layer: 2P of p-type thermoelectric conversion element: 10P.

In this embodiment, the n-type thermoelectric conversion material layer: 3N and the p-type thermoelectric conversion material layer: 3P are made of oxide material. An n-type thermoelectric conversion material layer: 3N is formed of iron oxide ($Fe_2O_3$), or zinc oxide (ZnO), and a p-type thermoelectric conversion material layer: 3P is formed of copper oxide ($Cu_2O$). In embodiment 1, all thermoelectric conversion material layers being oxides are formed by an ion plating method. As a target, Fe, Zn, Cu plates are used respectively, they are heated by an electron gun. As reactive gases, oxygen gas at 15 to 20 sccm, the nitrogen gas at 3 to 5 sccm are provided under reduced pressure of $10^{-3}$ Pa, their gases are reacted in a plasma which is generates by a high frequency, then oxide films are formed on the substrate (graphite). The oxide films having a thickness of about 0.3 μm are formed under conditions of a substrate temperature at 130° C., a high-frequency power output at 300 W, a substrate bias at 0 V, and a film forming rate of 0.5 to 1 nm/sec, and then they are annealed at 150° C. for 10 minutes under $N_2$ atmosphere. In this manner, thermoelectric conversion material layers are formed on the graphite sheet.

As mentioned above in this embodiment, the charge transport layers: 2N and 2P made of graphite are formed on the substrate: 1, and the thermoelectric conversion material layers: 3N and 3P made of oxide material is respectively laminated on both end surfaces of the charge transport layer. Ag (silver: hereinafter referred to as Ag) layers are formed by vapor deposition on the thermoelectric conversion material layers, and electrodes: 4 are formed by attaching Al (Aluminum: hereinafter referred to as Al) substrates with solder onto the Ag layers.

Through the above processes, the thermoelectric conversion element (FIG. 1) is produced.

[The Thermoelectric Conversion Module-Element: e1]

Next, the thermoelectric conversion module-element: e1 of the present invention is described based on FIG. 4.

FIG. 4 is an explanatory diagram for showing an example of production processes of the thermoelectric conversion module-element: e1 of the present invention.

The thermoelectric conversion module-element: e1 is constituted by forming a plurality of charge-transport-type thermoelectric conversion elements on one surface of one piece of insulating substrate: 1. The charge-transport-type thermoelectric conversion element comprises a charge transport layer and thermoelectric conversion material layers and electrodes, wherein, the charge transport layer is n-type charge transport layer which is made of a graphite sheet treated to dope charge-donating material so as to give an n-type semiconductor property, or p-type charge transport layer which is made of a graphite sheet treated to dope charge-accepting material so as to give a p-type semiconductor property. An n-type thermoelectric conversion element: 10N is constituted by forming n-type thermoelectric conversion material layers and electrodes on both end portions of the n-type charge transport layer, and a p-type thermoelectric conversion element: 10P is constituted by forming p-type thermoelectric conversion material layers and electrodes on both end portions of the p-type charge transport layer.

(Process 1)

As shown in FIG. 4(1), one piece of insulating substrate: 1 is prepared.

(Process 2)

Next, as shown in FIG. 4(2), a plurality of n-type charge transport layers: 2N and p-type charge transport layers: 2P are alternately disposed on one side of the insulating substrate: 1 while being spaced apart from each other at predetermined intervals.

(Process 3)

Next, as shown in FIG. 4(3), n-type thermoelectric conversion material layers: 3N are formed on the both end surfaces of the n-type charge transport layers: 2N, and p-type thermoelectric conversion material layers: 3P are formed on the both end surfaces of the p-type charge transport layer: 2P, respectively.

(Process 4)

Next, as shown in FIG. 4(4), electrodes: 4 are formed on the thermoelectric conversion material layers in the third layer of FIG. 4(3) so as to be in contact with both an n-type thermoelectric conversion material layer: 3N and a p-type thermoelectric conversion material layer: 3P, thus it becomes a structure which a plurality of n-type thermoelectric conversion material layers: 3N and a plurality of p-type thermoelectric conversion material layers: 3P are connected in series. Then, the electrical connection terminals: 5 are soldered and fixed on the side surfaces of both ends of the electrodes: 4 being a serpentine wiring.

Further, passivation films: 6 are formed on the central portions exposed the doping layer on the surfaces of the n-type charge transport layers: 2N and the p-type charge transport layers: 2P where the thermoelectric conversion material layers are not formed.

The passivation film: 6 is preferably nitride films such as silicon-nitride, aluminum-nitride or carbide films such as silicon carbide or fluorine resins such as polytetrafluoroethylene, polyvinylidene fluoride, tetrafluoroethylene-hexafluoropropylene.

Through the above processes, a thermoelectric conversion module-element: e1 is produced, in which a plurality of thermoelectric conversion elements constituted of n-type thermoelectric conversion elements: 10N and p-type thermoelectric conversion elements: 10P are arranged in series on one surface of the insulating substrate: 1.

[Thermoelectric Conversion Module-Element: e2]

Next, the thermoelectric conversion module-element: e2 of the present invention is described based on FIG. 5.

FIG. 5 is a schematic diagram of a thermoelectric conversion module-element: e2 of the present invention. FIG. 5(1) shows a top view of the thermoelectric conversion module-element: e2, and FIG. 5(2) shows a sectional view taken along line C-C of the thermoelectric conversion module-element: e2 in FIG. 5(1), and FIG. 5(3) shows a sectional view taken along line D-D of the thermoelectric conversion module-element: e2 in FIG. 5(1).

As shown in FIG. 5, the thermoelectric conversion module-element: e2 is constituted by forming charge-transport-type thermoelectric conversion elements on both faces of one piece of insulating substrate. The production methods of the thermoelectric conversion module-element: e2 are substantially the same as that of the thermoelectric conversion module-element: e1.

As shown in FIG. 5(2), n-type charge transport layers: 2N are disposed on both faces of the insulating substrate: 1. N-type thermoelectric conversion material layers: 3N are formed on the both end surfaces of the n-type charge transport layer: 2N on both faces, and electrodes: 4 are formed on the n-type thermoelectric conversion material layers: 3N. In the upper electrode: 4, a contact layer is formed on the side surface of the substrate so that electrodes: 4 on the front side and the back side should be in contact with each other, on the other hand, also in the lower electrode: 4, a contact layer is formed on the side surface of the substrate so that electrodes: 4 on the front side and the back side should be in contact with each other. Therefore, the n-type charge-transport-type thermoelectric conversion elements: 10N are respectively formed at the same position across the insulating substrate: 1, and they have a structure connected in parallel on the front and back sides.

As shown in FIG. 5(3), p-type charge-transport-type thermoelectric conversion elements: 10P are respectively formed at the same position across the insulating substrate: 1, and they have a structure connected in parallel on the front and back sides. As shown in FIG. 5(1), the n-type charge-transport-type thermoelectric conversion elements: 10N of FIG. 5(2) and the p-type charge-transport-type thermoelectric conversion elements: 10P of FIG. 5(3) are connected in series with electrodes: 4. Then, the electrical connection terminals: 5 are soldered and fixed on the side surfaces of both end portions of the electrodes: 4 being a serpentine wiring.

As described above, the thermoelectric conversion module-element: e2 has a constitution in which charge-transport-type thermoelectric conversion elements are formed on both faces of one piece of insulating substrate.

[Photothermal Conversion Substrate]

Next, the photothermal conversion substrates: 7 and 9 of the present invention are described based on FIG. 6.

FIG. 6 is schematic diagrams of photothermal conversion substrates: 7 and 9 used in the present invention. FIG. 6(1) shows a top view of a single layer photothermal conversion substrate used in the present invention, FIG. 6(2) shows a sectional view taken along line E-E in FIG. 6(1). And FIG. 6(3) shows a top view of a laminated photothermal conversion substrate used in the present invention, FIG. 6(4) shows a sectional view taken along line F-F in FIG. 6(3).

The photothermal conversion substrates: 7 and 9 are made of resin material or porous material which contain photothermal conversion material, As shown in FIGS. 6(1) and (2), the single layer photothermal conversion substrate: 7 made of resin or porous material which contains photothermal conversion material is used.

As shown in FIGS. 6(3) and (4), a laminated photothermal conversion substrate: 9 composed of a single layer photothermal conversion substrate: 7 and a substrate: 8 may be used, wherein a substrate: 8 is made of a material having thermal conductivity higher than that of the single layer photothermal conversion substrate: 7.

The photothermal conversion material is not particularly limited as long as it has a function of absorbing light and converting the light into heat, is preferably material selected from the group consisting of graphite, tin oxide, antimony oxide, zirconium oxide, zirconium carbide, cesium tungsten oxide, lanthanum hexaboride, metal nanoparticles and metal nitride nanoparticles.

As base material of the single layer photothermal conversion substrate: 7, it is preferable to use resin or porous material which has heat resistance and low thermal conductivity. As the resin, polypropylene, polyvinyl chloride, polycarbonate, polyethylene terephthalate, polyimide, polyamide imide, polyphenylene sulfide, polytetrafluoroethylene, fluororesin, allyl resin, epoxy resin, furan resin, silicone resin and the like may be used.

As the porous material, polypropylene, polyvinyl chloride, polycarbonate, porous sheets prepared by sintering powder such as fluororesin, or foamed resin such as foamed polypropylene, foamed polyurethane, foamed epoxy resin or foamed fluororesin may be used.

The single layer photothermal conversion substrate: 7 may be one prepared by applying a coating liquid containing photothermal conversion material on the surface of the substrate, or one prepared by dispersing photothermal conversion material at the time of manufacturing the substrate.

In the laminated photothermal conversion substrate: 9, the substrate: 8 disposed at the lower layer is preferably a substrate having thermal conductivity higher than that of the single layer photothermal conversion substrate: 7 disposed at the upper layer. As base material of the substrate: 8, it is preferable to use ceramic sheets comprising organic binders and powders such as silica, alumina, silicon carbide, silicon nitride, aluminum nitride, graphite and zirconia or use ceramic plates obtained by sintering the above mentioned powders.

[First Thermoelectric Conversion Module: M1]

Next, the first thermoelectric conversion module: M1 of the present invention are described based on FIG. 7.

FIG. 7 shows a top view of the first thermoelectric conversion module: M1 of the present invention.

In the first thermoelectric conversion module: M1 of the present invention, the single layer photothermal conversion substrate: 7 or the laminated photothermal conversion substrate: 9 is installed on electrodes: 4 at one end of the thermoelectric conversion module-element: e1 produced in the processes shown in FIG. 4 or on electrodes: 4 at one end of the thermoelectric conversion module-element: e2 produced in the processes shown in FIG. 5.

The thermoelectric conversion module: M1 of the present invention comprises a plurality of charge-transport-type thermoelectric conversion elements formed on an insulating substrate: 1 and a photothermal conversion substrate: 7 or 9, and it is suitable for mounting in low power device products. In particular, it is preferable to mount it on a smartphone, a mobile phone, a pad, a notebook computer, or the like.

As described above, the thermoelectric conversion module: M1 of the present invention comprises thermoelectric conversion module-elements: e1 or e2 in which a plurality of charge-transport-type thermoelectric conversion elements each having an n-type or a p-type charge transport layer are formed, and a photothermal conversion substrate: 7 or 9 containing photothermal conversion material.

The thermoelectric conversion element of the present invention is characterized in using the graphite surface as the charge transfer layer which is doped with either charge-donating material or charge-accepting material so as to give either an n-type or a p-type semiconductor property. The graphite sheet having semiconductor property has such a characteristic that it hardly causes heat generation or absorption even if it contacts with thermoelectric conversion material. Also, electric conductivity of the graphite surface having semiconductor property is higher than that of the conventional thermoelectric conversion material by 100 times or more, therefore the internal resistance of the element can be reduced. And by doping the charge-donating material or the charge-receiving material on the surface of the graphite sheet, it is possible to suppress the thermal conductivity of the graphite sheet surface to a low level. In addition, by providing a charge transport layer, it has got possible to use thermoelectric conversion material which has not been much used up to now because of their very low electric conductivity even though the Seebeck coefficient is high. Therefore, material having high Seebeck coefficient can be selected and used as thermoelectric conversion material. As a result, it is possible to provide a thermoelectric conversion element having an unprecedented output.

Further, the thermoelectric conversion module: M1 of the present invention uses thermoelectric conversion module-elements: e1 or e2 in which a plurality of charge-transport-type thermoelectric conversion elements are formed and has a photothermal conversion substrate: 7 or 9 containing photothermal conversion material, this makes it possible to generate power practically using solar heat and sunlight.

The present invention provides a thermoelectric conversion module: M1 having such excellent thermoelectric characteristics, and it provides a new energy conversion technology that is clean and reproducible.

In the structure of a conventional thermoelectric conversion element, the three characteristics of high Seebeck coefficient, high electric conductivity, and low thermal conductivity are required for a thermoelectric conversion material. Therefore, it was difficult to use the oxide material as thermoelectric conversion material, because their electric conductivity is as low as 0.5 S/cm or less, although their Seebeck coefficient is as high as 300 to 1000 μV/K. However, in the thermoelectric conversion element having the charge transport layer of the present invention, oxide material having high Seebeck coefficient can be used as the thermoelectric conversion material. Regarding electric conduction, the charge transport layer made of graphite having high electric conductivity plays a role. Regarding heat conduction also, the thermal conductivity can be greatly reduced by using the graphite surface doped with charge-donating material or charge-accepting material. As a result, it is possible to provide a high output thermoelectric conversion element.

Embodiment 1

Next, with reference to FIG. 4, FIG. 6 and FIG. 7, production processes of the thermoelectric conversion module: M1 according to Embodiment 1 of the present invention is described below. Here, the X direction in the figure is the length, the Y direction is the width, and the Z direction is the thickness.

(Process 1)

As shown in FIG. 4(1), an insulating substrate: 1 made of a polytetrafluoroethylene resin having a length of 100 mm×a width of 60 mm and a thickness of 1 mm was prepared as the first layer.

(Process 2)

Next, as shown in FIG. 4(2), charge transport layers: 2N and 2P are formed as the second layer on the substrate: 1. Here, three pieces of each PGS graphite sheet (2N) having a length of 15 mm×a width of 60 mm and a thickness of 100 μm doped with triphenylphosphine (TPP) as charge-donating material (n-type dopant) were prepared as the charge transport layer: 2N. And three pieces of each PGS graphite sheet (2P) having a length of 15 mm×a width of 60 mm and a thickness of 100 μm doped with tetracyanoquinodimethane (TCNQ) as charge-accepting material (p-type dopant) were prepared as the charge transport layer: 2P.

As shown in FIG. 4(2), as charge transport layers: 2N and 2P, graphite sheets (2N, 2P) subjected to the above treatment were disposed alternately at the positions of the charge transport layers: 2N and 2P on the insulating substrate: 1 so that their doping surfaces should face up respectively. A heat-resistant adhesive was used for the above arrangement.

Each graphite sheet (2N, 2P) was disposed so that its longitudinal direction is along the Y-direction, and three pieces of the N-type graphite sheets and three pieces of the P-type graphite sheets are disposed so that the N-type and the P-type graphite sheets alternately differ along the X-direction.

(Process 3)

Next, as shown in FIG. 4(3), thermoelectric conversion material layers: 3N and 3P are respectively formed as the third layer on the charge transport layers: 2N and 2P. Here, thermoelectric conversion material layers: 3N and 3P of each having a length of 15 mm×a width of 15 mm and a thickness of 200 μm were respectively formed on the both end surfaces of each graphite sheet (2N, 2P) forming the second layer. $Fe_2O_3$ as an n-type thermoelectric conversion material and $Cu_2O$ as a p-type thermoelectric conversion material were respectively formed by ion plating method as the thermoelectric conversion material layer: 3N or 3P.

(Process 4)

Next, as shown in FIG. 4(4), passivation films: 6 as the fourth layer are formed on the doped layer of the graphite sheet (2N, 2P), and electrodes: 4 are formed on the thermoelectric conversion material layers: 3N and 3P. Here, as the passivation films: 6, silicon nitride films having a thickness of 200 μm were formed by a plasma CVD method on the central portions exposed the doping layer on the surfaces of the graphite sheets (2N, 2P).

Next, Ag layers of each having a length of 15 mm×a width of 15 mm were formed on top surfaces of the thermoelectric conversion material layers: 3N and 3P by a vapor deposition method. Subsequently, Al substrates of each having a length of 15 mm×a width of 15 mm, a thickness of 100 μm, or a length of 31 mm×a width of 15 mm and a thickness of 100 μm were fixed by soldering on the Ag layers to form the electrodes: 4. Electrodes: 4 were arranged by bonding adjacent Ag layers with each other so that a route of electric charges flowing through the graphite layers (2N, 2P) should make a meander shape. Further, electrical connection terminals: 5 were fixed by soldering to the side surfaces of the electrodes: 4 at both ends of the meander shape mentioned above, wherein, the electrical connection terminal: 5 is a terminal comprising copper.

(Process 5)

Next, as shown in FIG. 7, the single layer photothermal conversion substrate: 7 is installed on the thermoelectric conversion module-element to complete the thermoelectric conversion module: M1 of the present invention. Here, as the single layer photothermal conversion substrate: 7, a photothermal conversion sheet which was prepared by applying a coating liquid letting cesium tungsten oxide particles disperse on the surface of a polyimide sheet was used. As shown in FIG. 6(1) and (2), a single layer photothermal conversion substrate: 7 having a length of 100 mm×a width of 20 mm and a thickness of 300 μm was prepared. As shown in FIG. 7, the single layer photothermal conversion substrate: 7 was installed in contact with the lower electrodes: 4 where the electrical connection terminals: 5 formed in process 4 of FIG. 4(4) were not fixed. Thus the thermoelectric conversion module: M1 according to Embodiment 1 of the present invention was fabricated. A heat resistant-adhesive was used for the above installation.

Embodiment 2

Next, with reference to FIG. 4, FIG. 6 and FIG. 7, production processes of the thermoelectric conversion module: M1 according to Embodiment 2 of the present invention is described below.

In the thermoelectric conversion module: M1 according to Embodiment 2, processes 1 to 4 shown in FIG. 4 were performed in the same manner as the thermoelectric conversion module: M1 according to Embodiment 1. The single layer photothermal conversion substrate: 7 in process 5 was changed the laminated photothermal conversion substrate 9 composed of the single layer photothermal conversion substrate 7 and the substrate 8 shown in FIG. 6(3).

As the single layer photothermal conversion substrate: 7, a photothermal conversion sheet which was prepared by applying a coating liquid letting cesium tungsten oxide particles disperse on the surface of a polyimide sheet was used. As the substrate 8, an alumina sheet which was prepared by using alumina ($Al_2O_3$) powder and polyvinyl butyral as a binder was used. As shown in FIG. 6(4), the single layer photothermal conversion substrate: 7 and the substrate: 8 were laminated with a heat-resistant adhesive, and the laminated photothermal conversion substrate: 9 having a length of 100 mm×a width of 20 mm and a thickness of 600 μm was prepared.

As shown in FIG. 7, the laminated photothermal conversion substrate 9 was installed in contact with the lower electrodes: 4 where the electrical connection terminals: 5 formed in process 4 of FIG. 4(4) were not fixed. Thus the thermoelectric conversion module: M1 according to Embodiment 2 of the present invention was fabricated. A heat resistant-adhesive was used for the above installation.

In Embodiments 1 and 2, three sets of the thermoelectric conversion element were fabricated in which the n-type thermoelectric conversion element: 10N and the p-type thermoelectric conversion element: 10P were connected in series on the insulating substrate: 1, and the three sets of thermoelectric conversion elements were connected in series, thus the thermoelectric conversion module: M1 was fabricated. It is to be noted that specific connection configuration in series/parallel for the n-type thermoelectric conversion elements: 10N and the p-type thermoelectric conversion elements: 10P and the number of elements are not limited to the above examples.

[Second Thermoelectric Conversion Module: M2]

Next, the second thermoelectric conversion module: M2 of the present invention are described based on FIG. 8 and FIG. 9.

FIG. 8 is a schematic diagram of the second thermoelectric conversion module: M2 of the present invention. FIG. 8(1) shows a perspective view of the second thermoelectric conversion module: M2, and FIG. 8(2) shows a top view of the second thermoelectric conversion module: M2. Also, FIG. 9 shows a sectional view of the support-substrate: 11 or 13 of the second thermoelectric conversion module: M2 shown in FIG. 8. FIG. 9(1) shows a sectional view taken along line G-G in FIG. 8(2) of the single layer support-substrate: 11 used as the support-substrate, and FIG. 9(2) shows a sectional view taken along the line G-G in FIG. 8(2) of the laminated support-substrate: 13 used as the support-substrate.

As shown in FIG. 8(1), the second thermoelectric conversion module: M2 of the present invention comprises support-columns: 16, a photothermal conversion substrate: 7 or 9, and a support-substrate: 11 or 13.

More specifically, the thermoelectric conversion module: M2 of the present invention has a configuration in which the single layer support-substrate: 11 or the laminated support-substrate: 13 is placed at its lower surface, the single layer photothermal conversion substrate: 7 or the laminated photothermal conversion substrate: 9 is installed on its upper surface, and the thermoelectric conversion module-elements: e1 or e2 are mounted between the upper surface and the lower surface, further, the electric connection terminals: 15 are placed so as to make contact with the electric connection terminals: 5 of the thermoelectric conversion module-element: e1 or e2, and each thermoelectric conversion module-element: e1 or e2 is connected in series.

The support-substrate may be the single layer support-substrate: 11 as shown in FIG. 9(1), or the laminated support-substrate: 13 composed of the single layer support-substrate: 11 and the substrate 12 made of a material having thermal conductivity higher than that of the single layer support-substrate: 11 as shown in FIG. 9(2). As base material of the substrate: 11, it is preferable to use ceramic sheets comprising organic binders and powders such as silica, alumina, silicon carbide, silicon nitride, aluminum nitride, graphite and zirconia or use ceramic plates obtained by sintering the above mentioned powders.

[Third Thermoelectric Conversion Module: M3]

Next, the second thermoelectric conversion module: M3 of the present invention are described based on FIGS. 10 to 12.

FIG. 10 is a schematic diagram of the third thermoelectric conversion module: M3 of the present invention. FIG. 10(1) shows a perspective view of the third thermoelectric conversion module: M3, and FIG. 10(2) shows a top view of the third thermoelectric conversion module: M3. Also, FIG. 11(1) is a bottom view of a photothermal conversion substrate of the third thermoelectric conversion module: M3. And, FIG. 11(2) is a top view of a support-substrate of the third thermoelectric conversion module: M3.

In the thermoelectric conversion module: M3, grooves are formed in the bottom surface of the photothermal conversion substrate and the top surface of the support-substrate, so that the thermoelectric conversion module-elements can be taken in and out along the grooves.

As shown in FIG. 12, a plurality of grooves: 14 are formed on the top surface of the support-substrate: 11 or 13 of the thermoelectric conversion module: M3. Further, as shown in FIG. 11, a number of grooves: 14 are formed on the bottom surface of the photothermal conversion substrate: 7 or 9 of the thermoelectric conversion module: M3, and electrical connection terminals: 15 are placed at the end of the grooves: 14. When the thermoelectric conversion module-elements: e1 or e2 are arranged along the groove 14, the electrical connection terminals: 5 of the thermoelectric conversion module-elements: e1 or e2 and the electrical connection terminals: 15 of the thermoelectric conversion module: M3 are in contact with each other. Here, a structure in which each thermoelectric conversion module-element: e1 or e2 connects in series is shown.

As shown in FIG. 10, in the thermoelectric conversion module: M3, a plurality of thermoelectric conversion module-elements: e1 or e2 are mounted between the photothermal conversion substrate: 7 or 9 and the support-substrate: 11 or 13 so that they can be taken in and out along the grooves: 14. Here, a drawing in which the thermoelectric conversion module-elements are mounted halfway for illustrating the grooves is shown, but the basic configuration is that the thermoelectric conversion module-elements are mounted fully filled.

Next, embodiments of the thermoelectric conversion modules: M2, M3 of the present invention are described based on FIGS. 4 to 12.

Embodiment 3

First, according to FIG. 4 and FIG. 5, production processes 1 to 6 of the thermoelectric conversion module-element: e2 is described below. Subsequently, production process 7 of the thermoelectric conversion module: M2 shown in FIG. 8 is described. Here, the X direction in the figure is the length, the Y direction is the width, and the Z direction is the thickness.

(Process 1)

As shown in FIG. 4(1), an insulating substrate: 1 made of a glass-epoxy sheet having a length of 307 mm×a width of 120 mm and a thickness of 5 mm was prepared as the first layer.

(Process 2)

Next, as shown in FIG. 4(2), charge transport layers: 2N and 2P are formed as the second layer on the substrate: 1. Here, six pieces of each PGS graphite sheet (2N) having a length of 50 mm×a width of 120 mm and a thickness of 100 µm doped with triphenylphosphine (TPP) as charge-donating material (n-type dopant) were prepared as the charge transport layer: 2N. And six pieces of each PGS graphite sheet (2P) having a length of 50 mm×a width of 120 mm and a thickness of 100 µm doped with tetracyanoquinodimethane (TCNQ) as charge-accepting material (p-type dopant) were prepared as the charge transport layer: 2P.

As shown in FIG. 4(2), as charge transport layers: 2N and 2P, three pieces of each graphite sheet (2N, 2P) subjected to the above treatment were disposed alternately at the positions of the charge transport layers: 2N and 2P on the insulating substrate: 1 so that their doping surfaces should face up respectively. A heat-resistant adhesive was used for the above arrangement. Each graphite sheet (2N, 2P) was disposed so that its longitudinal direction is along the Y-direction, and three pieces of the N-type graphite sheets and three pieces of the P-type graphite sheets are disposed so that the N-type and the P-type graphite sheets alternately differ along the X-direction.

(Process 3)

Next, as shown in FIG. 4(3), thermoelectric conversion material layers: 3N and 3P are respectively formed as the third layer on the charge transport layers: 2N and 2P. Here, thermoelectric conversion material layers: 3N and 3P of each having a length of 50 mm×a width of 30 mm and a thickness of 200 µm were respectively formed on the both end surfaces of each graphite sheet (2N, 2P) forming the second layer disposed on the front side of the insulating substrate: 1. And ZnO as an n-type thermoelectric conversion material and $Cu_2O$ as a p-type thermoelectric conversion material were respectively formed by ion plating method as the thermoelectric conversion material layers: 3N or 3P.

Subsequently, as shown in FIG. 4(4), as the passivation films: 6, silicon nitride films having a thickness of 200 µm were formed by a plasma CVD method on the central portions exposed the doping layer on the surfaces of the graphite sheets (2N, 2P).

(Process 4)

Next, as shown in FIG. 4(2), charge transport layers: 2N and 2P are formed as the second layer on the back side of the insulating substrate: 1. At this time, the charge transport layers: 2N and 2P having the same conductivity type as that of the charge transport layers: 2N and 2P formed on the front side of the insulating substrate: 1 are disposed at the same positions of the back side of the insulating substrate: 1. That is, if n-type is formed on the front side, n-type is also formed at the same position of the back side, and if p-type is formed on the front side, p-type is also formed at the same position of the back side.

Here, three pieces of each PGS graphite sheet (2N, 2P) having a length of 50 mm×a width of 120 mm, and a thickness of 100 µm produced in process 2 were respectively disposed alternately on the back side of the insulating substrate: 1 so that their doping surfaces should face up. A heat-resistant adhesive was used for the above arrangement.
(Process 5)

Next, as shown in FIG. 4(3), thermoelectric conversion material layers: 3N and 3P are respectively formed as the third layer on the charge transport layers: 2N and 2P disposed on the back side of the insulating substrate: 1. Here, thermoelectric conversion material layers: 3N and 3P of each having a length of 50 mm×a width of 30 mm and a thickness of 200 µm were respectively formed on the both end surfaces of each graphite sheet (2N, 2P) forming the second layer disposed on the back side of the insulating substrate: 1. ZnO as an n-type thermoelectric conversion material and $Cu_2O$ as a p-type thermoelectric conversion material were respectively formed by ion plating method as the thermoelectric conversion material layers: 3N or 3P.

Subsequently, as shown in FIG. 4(4), as the passivation films: 6, silicon nitride films having a thickness of 200 µm were formed by a plasma CVD method on the central portions exposed the doping layer on the surfaces of the graphite sheets (2N, 2P).
(Process 6)

Next, Ag layers of each having a length of 50 mm×a width of 30 mm were formed by a vapor deposition method on top surfaces of the thermoelectric conversion material layers: 3N and 3P formed on the front side of the insulating substrate: 1. Subsequently, Ag layers of each having a length of 50 mm×a width of 30 mm were formed by a vapor deposition method on top surfaces of the thermoelectric conversion material layers: 3N and 3P formed on the back side of the insulating substrate: 1. Ag paste was applied to the side surface of the insulating substrate 1 sandwiching the Ag layers on the front side and the back side so that they should be in contact with each other.

Next, Al substrates of each having a length of 50 mm×a width of 66 mm, a thickness of 50 µm, or a length of 101 mm×a width of 66 mm and a thickness of 50 µm were formed in a U-shape, and they were fixed by soldering so as to cover the Ag layers as shown in FIGS. 5(2) and (3), thus the electrodes: 4 were formed. Electrodes: 4 were arranged by bonding adjacent Ag layers with each other so that a route of electric charges flowing through the graphite layers (2N, 2P) should make a meander shape.

Further, electrical connection terminals: 5 were fixed by soldering to the side surfaces of the electrodes: 4 at both ends of the meander shape mentioned above, wherein, the electrical connection terminal: 5 is a terminal comprising copper.

Through the above processes, the thermoelectric conversion module-element: e2 was produced, in which three sets each of n-type thermoelectric conversion elements: 10N and p-type thermoelectric conversion elements: 10P connected in parallel on the front and back sides of the insulating substrate: 1 were formed, and their n-type thermoelectric conversion elements 10N and their p-type thermoelectric conversion elements 10P were connected in series. It is to be noted that specific connection configuration in series/parallel for the n-type thermoelectric conversion elements: 10N and the p-type thermoelectric conversion elements: 10P and the number of elements are not limited to the examples.
(Process 7)

Next, as shown in FIG. 8, the thermoelectric conversion module: M2 which was composed of support-columns: 16, a photothermal conversion substrate: 7 or 9, a support-substrate: 11 or 13, and thermoelectric conversion module-elements was fabricated.

As the photothermal conversion substrate, a porous sheet which was prepared by dispersing cesium tungsten oxide particles in tetrafluoroethylene resin particles and sintering was used. As shown in FIGS. 6(1) and (2), a single layer photothermal conversion substrate: 7 having a length of 210 mm×a width of 310 mm and a thickness of 3 mm was prepared.

As the support-substrate, a ceramic substrate sintered with alumina was used. As shown in FIG. 9(1), a single layer support-substrate: 11 having a length of 210 mm×a width of 310 mm and a thickness of 5 mm was prepared.

As the support-column, four pieces of support-column: 16 made of glass-epoxy having a height of 120 mm were prepared. And as thermoelectric conversion module-element, ten pieces of thermoelectric conversion module-element: e2 produced in processes 1 to 6 were prepared.

As shown in FIG. 8, four pieces of the support-column: 16 and ten pieces of the thermoelectric conversion module-element: e2 were installed on the single layer support-substrate: 11, and the single layer photothermal conversion substrate: 7 was mounted thereon. A heat resistant-adhesive was used for the installation. Next, the electrical connection terminals: 15 were placed so as to connect adjacent electrical connection terminals: 5, thus the thermoelectric conversion module: M2 of the present invention was fabricated, wherein, the electric connection terminal: 15 is a terminal comprising copper and set by soldering.

Through the above processes, the thermoelectric conversion module: M2 shown in FIG. 8 was fabricated. It is to be noted that the number of thermoelectric conversion module-elements, connection configuration for them, and the size of the module are not limited to the examples.

Embodiment 4

Next, the thermoelectric conversion module: M3 shown in FIG. 10 was fabricated. In the thermoelectric conversion module: M3, the thermoelectric conversion module-element: e2 was produced in the same processes as the processes 1 to 6 of the embodiment 3, and with respect to the photothermal conversion substrate and the support-substrate in process 7, grooves were formed on the bottom surface of the photothermal conversion substrate and on the top surface of the support-substrate, so that the thermoelectric conversion module-elements could be taken in and out along the grooves.

As the photothermal conversion substrate, a laminated photothermal conversion substrate: 9 composed of a single layer photothermal conversion substrate: 7 and a substrate: 8 shown in FIGS. 6(3) and (4) may be used.

As the photothermal conversion substrate, a porous sheet which was prepared by dispersing cesium tungsten oxide particles in tetrafluoroethylene resin particles and sintering was used. As the substrate 8, an alumina sheet which was prepared by using alumina ($Al_2O_3$) powder and polyvinyl butyral as a binder was used. The single layer photothermal conversion substrate: 7 and the substrate: 8 were laminated with a heat-resistant adhesive, and the laminated photothermal conversion substrate: 9 having a length of 210 mm×a width of 310 mm and a thickness of 6 mm was prepared.

FIG. 11 is a bottom view of the photothermal conversion substrate: 9. Ten grooves: 14 of each having a width of 6 mm and a depth of 1.5 mm were formed on the bottom surface of the laminated photothermal conversion substrate: 9, and electrical connection terminals: 15 was placed at the end of the groove 14. When the thermoelectric conversion module-elements: e2 are arranged along the groove 14, the electrical connection terminals: 5 of the thermoelectric conversion module-elements: e2 and the electrical connection terminals: 15 of the thermoelectric conversion module: M3 are in contact with each other, wherein, the electric connection terminal: 15 is a terminal comprising copper and set by a heat-resistant adhesive. Here, a structure in which each thermoelectric conversion module-element: e2 connects in series is shown.

As the support-substrate, the laminated support-substrate: 13 composed of the single layer support-substrate: 11 and the substrate: 12 shown in FIG. 9(2) was used. As the single layer support-substrate: 11, a ceramic substrate sintered with alumina was used. As the substrate: 12, a copper plate was used. The single layer support-substrate: 11 and the substrate: 12 were laminated with a heat-resistant adhesive, and the laminated support-substrate: 13 having a length of 210 mm×a width of 310 mm and a thickness of 10 mm was prepared.

FIG. 12 is a top view of the support-substrate. Ten grooves: 14 of each having a width of 6 mm and a depth of 1 mm were formed on the top surface of the laminated support-substrate: 13.

As support-column, four pieces of support-column: 16 made of glass-epoxy having a height of 118 mm were prepared. And as thermoelectric conversion module-element, ten pieces of thermoelectric conversion module-element: e2 produced in processes 1 to 6 were prepared.

As shown in FIG. 10, four pieces of the support-column: 16 were installed on the laminated support-substrate: 13, and the laminated photothermal conversion substrate: 9 was mounted thereon. A heat resistant-adhesive was used for the installation. Finally, the thermoelectric conversion module-elements: e2 were inserted along the grooves, thus the thermoelectric conversion module: M3 of the present invention was fabricated.

Through the above processes, the thermoelectric conversion module: M3 shown in FIG. 10 was fabricated. It is to be noted that the number of thermoelectric conversion module-elements, connection configuration for them, and the size of the module are not limited to the examples.

DESCRIPTION OF REFERENCE NUMERALS

1: insulating substrate
2N: n-type charge transport layer
2P: p-type charge transport layer
3N: n-type thermoelectric conversion material layer
3P: p-type thermoelectric conversion material layer
4: electrode
5: electrical connection terminal
6: passivation film
7: single layer photothermal conversion substrate
8: substrate
9: laminated photothermal conversion substrate
10N: n-type thermoelectric conversion element
10P: p-type thermoelectric conversion element
11: single layer support-substrate
12: substrate
13: laminated support-substrate
14: groove
15: electrical connection terminal
16: support-column
100: conventional thermoelectric conversion element
120, 121, 180: electrode
130: n-type thermoelectric conversion material
131: p-type thermoelectric conversion material
e1, e2: thermoelectric conversion module-element
M1, M2, M3: thermoelectric conversion module

What is claimed is:

1. A thermoelectric conversion module comprises at least a thermoelectric conversion module-element and a photothermal conversion substrate containing photothermal conversion material,
wherein the thermoelectric conversion module-element comprises at least an n-type thermoelectric conversion element and at least a p-type thermoelectric conversion element,
wherein the n-type thermoelectric conversion element comprises at least an n-type charge transport layer and two n-type thermoelectric conversion material layers and two first electrodes,
wherein the n-type charge transport layer comprises a surface of a graphite doped with charge-donating material so that the surface has an n-type semiconductor property and so that the thermal conductivity in the in-plane direction of the doped surface of the graphite is reduced by doping the charge-donating material,
wherein the two n-type thermoelectric conversion material layers are formed apart from each other on the same side of the doped graphite surface of the n-type charge transport layer, and the two first electrodes are formed on an upper part of the two n-type thermoelectric conversion material layers respectively,
wherein the p-type thermoelectric conversion element comprises at least a p-type charge transport layer and two p-type thermoelectric conversion material layers and two second electrodes,
wherein the p-type charge transport layer comprises a surface of a graphite doped with charge-accepting material so that the surface has a p-type semiconductor property and that the thermal conductivity in the in-plane direction of the doped surface of the graphite is reduced by doping the charge-accepting material,
wherein the two p-type thermoelectric conversion material layers are formed apart from each other on the same side of the doped graphite surface of the p-type charge transport layer, and the two second electrodes are formed on an upper part of the two p-type thermoelectric conversion material layers respectively,
wherein one of the two first electrodes of the n-type thermoelectric conversion element is electrically connected to one of the two second electrodes of the p-type thermoelectric conversion element to form the thermoelectric conversion module-element, and
wherein the photothermal conversion substrate is disposed so that the photothermal conversion substrate absorbs external light and converts the light into heat and transfers the generated heat to one of the two n-type thermoelectric conversion material layers of the n-type thermoelectric conversion element and one of the two p-type thermoelectric conversion material layers of the p-type thermoelectric conversion element.

2. The thermoelectric conversion module according to claim 1, wherein the thermoelectric conversion module further comprises an insulating substrate, wherein the at least a thermoelectric conversion module-element is a plurality of the thermoelectric conversion module elements, and wherein the thermoelectric conversion module has a structure in which at least a pair of the thermoelectric conversion module-elements are formed on the front and back surfaces of the insulating substrate.

3. The thermoelectric conversion module according to claim 1, wherein the photothermal conversion substrate is made of resin containing photothermal conversion material.

4. The thermoelectric conversion module according to claim 1, wherein, the photothermal conversion substrate is made of porous material containing photothermal conversion material.

5. The thermoelectric conversion module according to claim 1, wherein the photothermal conversion material is selected from the group consisting of graphite, tin oxide, antimony oxide, zirconium oxide, zirconium carbide, cesium tungsten oxide, lanthanum hexaboride, metal nanoparticles and metal nitride nanoparticles.

6. The thermoelectric conversion module according to claim 1, wherein the photothermal conversion substrate comprises a top surface serving as a light receiving surface and a bottom surface contacting an end portion of the thermoelectric conversion module-element.

* * * * *